United States Patent [19]
Keller et al.

[11] Patent Number: 5,338,395
[45] Date of Patent: Aug. 16, 1994

[54] METHOD FOR ENHANCING ETCH UNIFORMITY USEFUL IN ETCHING SUBMICRON NITRIDE FEATURES

[75] Inventors: David J. Keller, Boise; Debra K. Gould, Nampa, both of Id.

[73] Assignee: Micron Semiconductor, Inc., Boise, Id.

[21] Appl. No.: 29,262

[22] Filed: Mar. 10, 1993

[51] Int. Cl.$^5$ .................................. H01L 21/306
[52] U.S. Cl. ............................ 156/643; 156/650; 156/651; 156/652; 156/653
[58] Field of Search ............. 156/643, 650, 651, 652, 156/653

[56] References Cited

U.S. PATENT DOCUMENTS

| | | | |
|---|---|---|---|
| 4,484,979 | 11/1984 | Stocker | 156/653 |
| 4,568,410 | 2/1986 | Thornquist | 156/653 |
| 4,717,447 | 1/1988 | Dieleman et al. | 156/653 |
| 4,793,897 | 12/1988 | Dunfield et al. | 156/653 |
| 5,167,762 | 12/1992 | Carr et al. | 156/651 |
| 5,180,466 | 1/1993 | Shin | 156/653 |

FOREIGN PATENT DOCUMENTS

| | | |
|---|---|---|
| 0424299 | 4/1991 | European Pat. Off. |
| 0099533 | 4/1988 | Japan |
| 0112731 | 5/1989 | Japan |
| 0271614 | 11/1990 | Japan |

OTHER PUBLICATIONS

Sparks; "Plasma Etching of Si, SiO$_2$, Si$_3$N$_4$, and Resist with Fluorine, Chlorine, and Bromine Compounds"; J. Electrochem. Soc; vol. 139, No. 6, Jun. 1992, pp. 1736–1741.

Hayasaka et al., "Highly Selective Etching of Si$_3$N$_4$ Over SiO$_2$ Employing a Downstream Type Reactor", Solid State Technology Apr. 1988; pp. 127–130.

*Primary Examiner*—Tom Thomas
*Assistant Examiner*—Trung Dang
*Attorney, Agent, or Firm*—Lia M. Pappas

[57] ABSTRACT

An etch process wherein halogen ions are employed to bombard a patterned nitride layer thereby creating substantially vertical sidewalls, especially useful when etching submicron features.

A process in which NF$_3$ ions are combined with halogen ions in a reactive ion etcher to etch a patterned layer, followed, in situ, by an overetch of NF$_3$ ions and an ionized hydrogen halide. An inert gas can be added to further increase the uniformity of the etch.

19 Claims, 1 Drawing Sheet

METHOD FOR ENHANCING ETCH UNIFORMITY USEFUL IN ETCHING SUBMICRON NITRIDE FEATURES

FIELD OF THE INVENTION

This invention relates to semiconductor manufacture, and more particularly to the process of enhancing etch uniformity, especially when etching a layer of nitride over oxide, useful in the LOCOS process.

BACKGROUND OF THE INVENTION

As semiconductor device dimensions get smaller, and device density increases, it becomes more and more difficult to build an efficient and reliable isolation process to separate active devices. One drawback with the LOCal Oxidation of Silicon (LOCOS) is the decreasing pad thickness which makes etch steps more difficult.

The process of the present invention provides a new nitride etch that is suitable for etching submicron features, and that stops on a thin pad oxide without substantially pitting the underlying silicon. These characteristics make the process of the present invention well suited for use in the conventional LOCOS process.

A lot of ion bombardment is used in the process of the present invention to cause the desired chemical reactions, hence this etch is more physical than chemical in nature. Because the etch is more physical, there is a lot less "loading."

"Loading" refers to uneven etching of the wafer. If there is less "loading, then the "open" and "tight" areas will etch at substantially the same rate. "Open" refers to the less confined spaces of the semiconductor device, such as the periphery of the device or the scribe lines, which tend to etch at a faster rate than "tight" areas. "Tight" refers to the more constricted areas of the semiconductor device, such as the area within the array and the runners between transistors.

Further, with the process of the present invention, there is no significant center to edge "loading" effect. Center to edge "loading" effect refers to a characteristic nonuniformity in etching wherein the center of a wafer etches at a slower rate than the edges, thereby resulting in a wafer which is thicker in the center than at the edges. If there is very little center to edge "loading" effect, then the etch uniformity across the wafer will be very good.

Other manufacturers are currently using $CF_4$, $CHF_3$ chemistries or other types of fluorine containing chemistries, if they perform a nitride etch in their fabrication processes.

These and other known processes suffer from either poor "loading" effects, poor uniformity, or poor nitride to oxide selectivity, which will make these processes inadequate for etching submicron nitride features.

SUMMARY OF THE INVENTION

The primary object of the present invention is to overcome the problems of the prior art processes.

The process of the present invention employs the use of etchants which are more physical than chemical in nature to combat "loading" effects in etch processes requiring a significant amount selectivity between different materials.

The main etch uses a $Cl_2$, $NF_3$ chemistry. The majority of the gas flow is $Cl_2$. The reaction is very physical in nature, involving ion bombardment. Then, the process of the present invention employs a highly selective nitride-to-pad oxide second step. The second step uses a $NF_3$, HBr chemistry. The fluorine from the $NF_3$ gives a very fast nitride etch rate, while the bromine from the HBr gives a very slow pad oxide etch rate. Endpoint detection plus a percentage overetch is used to determine the length of this step. The use of endpoint detection allows for a very repeatable process, wafer to wafer, and lot to lot.

One advantage is that this process shows very little loading effect (i.e., the tight areas etch at the same relative rate as the open areas). The etch is very uniform (the etch uniformity is 3-5%). Therefore, less overetching is necessary to clear the remaining nitride. The etch is very selective to the underlying pad oxide (selectivity to of nitride:oxide is about 6:1). All these attributes enable the etching of very small submicron geometries, while stopping on thin pad oxides. As previously stated, this process is very effective for submicron features of less than 0.5 $\mu$m.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

Figure 1:
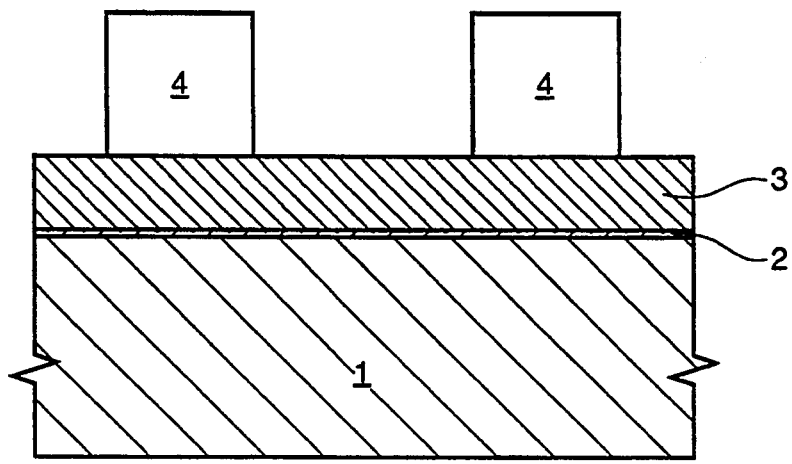
FIG. 1 is a schematic cross section of a patterned semiconductor substrate.

Referring to FIG. 1, a patterned substrate commonly used in a conventional LOCOS process is illustrated. It will serve as a representative example. However, one having ordinary skill in the art, upon being apprised of the process of the present invention, would know how to apply it to other process steps involving etching.

In FIG. 1, a substrate 1 is illustrated on which has been disposed a thin pad oxide 2. The substrate 1 is preferably a semiconductor material, of which silicon is preferred. The pad oxide 2 can be either grown or deposited to a depth of approximately 250 Å, the preferred method being that of growing the oxide in the appropriate ambient. Superjacent the pad oxide 2 is a layer 3 having a depth of approximately 2400 Å.

Layer 3 is preferably a nitride layer. In this particular etch, layer 3 acts as a protective or resistant area to cover the future active areas during the subsequent field oxidation process. The nitride layer 3 is deposited by any method known in the art.

A photoresist layer 4 is deposited and patterned on top of the nitride layer 3. The photoresist layer 4 may define features having submicron geometries in the approximate range of 0.5 $\mu$m. Of course, larger geometries can also be patterned.

Figure 2:
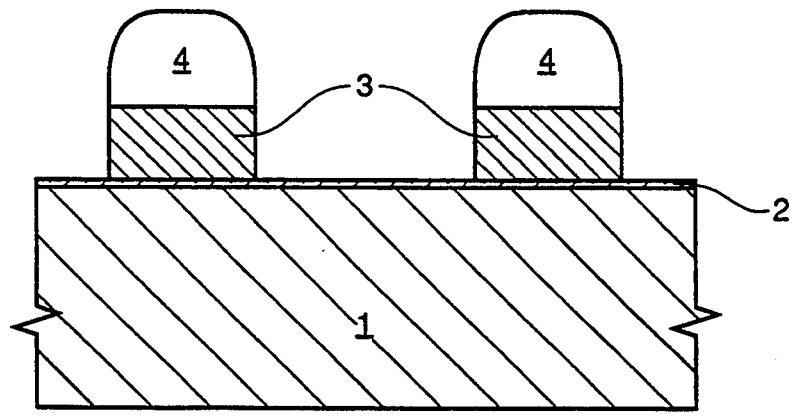
FIG. 2 is a schematic cross section of the semiconductor substrate of FIG. 1, subsequent to etching according to the process of the present invention.

The structure of FIG. 1 is then etched according to the process of the present invention to result in the structure depicted in FIG. 2. The etch of the present invention has a basis in the physical nature of the reaction, more specifically in ion bombardment. Hence, the process of the present invention is most effective when performed in a chamber in which ions can be accelerated. Such chambers are known in the art, and include, but are not limited to, reactive ion etchers, preferably magnetically enhanced reactive ion etchers, and high density source etchers.

The present invention involves the physical impact of the ions which enables the reaction proceed, as compared to a simple chemical reaction. While the invention anticipates chemical reaction, it uses the physical impact of the etchant chemical ions to enhance the uniformity of the etch process.

The process of the present invention comprises two etch steps, preferably performed in situ, i.e., in the same reaction chamber. The first step, or main etch comprises flowing a halogen, such as, for example, chlorine ($Cl_2$) at a rate of approximately 45 sccm, and a fluorine containing compound, preferably nitrogen fluoride ($NF_3$) at a rate of approximately 5 sccm for a time in the approximate range of 30–60 seconds. The preferred pressure is in the approximate range of 100 mtorr and the preferred power is approximately 500 watts. Of course, one having ordinary skill in the art will realize that the above values will vary depending on the make and model of the etcher used in the process. The etch processes were carried out in an Applied 5000 Magnetically Enhanced Reactive Ion Etcher, sold by Applied Materials Corporation of Santa Clara, Calif.

An inert gas, preferably argon (Ar) can also be added to the etch plasma. The inert gas tends to further enhance the uniformity of the etch process. Argon is preferred because of its weight and commercial availability, but the other inert gases can also be used.

The preferred embodiment employs a $Cl_2$, $NF_3$ chemistry in the main etch step. The majority of the gas flow is $Cl_2$, (chlorine tends to be more physical than fluorine) from which ions are accelerated toward the substrate 1. When $Cl_2$ reacts with the silicon in a $Si_3N_4$ molecule, it forms a volatile $SiCl_y$. The reaction is very physical in nature because of the acceleration of the ions during ion bombardment.

It should also be noted that because of the high $Cl_2$ ion bombardment, the $Cl_2$ step must be stopped before the nitride layer 3 is clear. If the nitride layer 3 is allowed to clear, the high ion bombardment will cause the $Cl_2$ to "punch through," i.e., penetrate, the oxide layer 2. Hence, the $Cl_2$ step is stopped while there is still a fair amount of the nitride layer 3 left on the wafer 1.

One drawback of such a physical $Cl_2$ etch, is that it has very poor selectivity to the underlying pad oxide 2. To substantially alleviate this problem, the process of the present invention employs a highly selective nitride-to-pad oxide second step.

The second part of the process of the present invention, also known as the "overetch" step, comprises flowing a fluorine containing compound, preferably $NF_3$ at a rate of approximately 23 sccm, along with a hydrogen halide, such as, for example, HCl, HI, and HBr at a rate of approximately 15 sccm. The preferred hydrogen halide is HBr. The overetch uses endpoint detection, and lasts about 35 seconds. The preferred pressure is in the approximate range of 300 mtorr, and the preferred power is in the approximate range of 200 watts. Once again, these parameters will vary with the make and model of etcher employed in the process.

The preferred embodiment has a second step which uses a $NF_3$, HBr chemistry. The fluorine from the $NF_3$ gives a very fast nitride 3 etch rate, while the bromine from the HBr gives a very slow pad oxide 2 etch rate.

Endpoint detection plus a percentage overetch is used to determine the length of this step because the use of endpoint detection allows for a very repeatable process, wafer to wafer, and lot to lot.

The process of the present invention results in a substantially anisotropic etch, i.e., the walls of the etched nitride features 3 are substantially normal (i.e., perpendicular) to the substrate surface 1. There is essentially no undercutting apparent in the nitride features 3. Thus, submicron features can be etched with considerable reliability. Although the photoresist pattern 4 may exhibit some faceting, this does not have any notable impact on the resulting nitride features 3.

Figure 3:
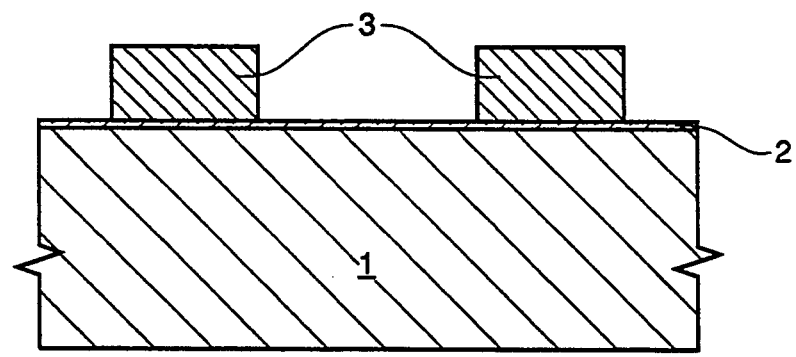
FIG. 3 is a schematic cross section of the semiconductor substrate of FIG. 2, after the photoresist has been stripped.

FIG. 3 illustrates the structure of FIG. 2 after the photoresist 4 has been "stripped," i.e., removed. At this point, in a LOCOS process, for example, the substrate 1 can be oxidized to form the field oxide regions.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the process of the present invention is not limited to nitride etches, but is also applicable to other etches requiring selectivity and uniformity.

What is claimed is:

1. An etch process for improving etch uniformity, comprising the following steps of:
   bombarding a layered substrate with an ionized halogen and ionized $NF_3$, said substrate having at least one nitride layer disposed thereon, said nitride layer being patterned; and
   bombarding said layered substrate with an ionized hydrogen halide and ionized $NF_3$, said ionized hydrogen halide and ionized $NF_3$ removing portions said nitride layer, thereby creating substantially straight sidewalls in said nitride layer.

2. The process according to claim 1, wherein:
   said layered substrate comprises a layer of oxide subjacent said nitride layer.

3. The process according to claim 1, wherein said hydrogen halide comprises at least one of HBr, HCl, and HI.

4. The process according to claim 3, wherein said ions are generated in a reactive ion etcher.

5. The process according to claim 4, wherein said pattern defines features, said features having a size of approximately 1.0 μm or less.

6. The process according to claim 5, wherein said ionized halogen is chlorine.

7. The process according to claim 2, wherein an inert gas is added to said ionized halogen and said ionized $NF_3$, said inert gas being argon.

8. An etch process having a substantial physical component comprising the following steps of:
   exposing a semiconductor substrate to ionized $Cl_2$, said substrate having at least one layer of nitride disposed thereon, said ionized $Cl_2$ etching sidewalls in said nitride layer, said sidewalls being substantially normal to said substrate;
   exposing said semiconductor substrate to an ionized hydrogen halide.

9. The process of claim 8, wherein said substrate is exposed to ionized NF$_3$ in combination with said ionized Cl$_2$.

10. The process of claim 9, wherein said substrate is exposed to ionized NF$_3$ in combination with said ionized hydrogen halide.

11. The process of claim 10, wherein said nitride layer is disposed on an oxide layer, said nitride layer being patterned with a photoresist layer, said ionized hydrogen halide enhancing selectivity to said oxide layer.

12. The process of claim 11, wherein said ions are generated in at least one of a reactive ion etcher, a magnetically enhanced reactive ion etcher, and a high density source reactor.

13. The process of claim 12, wherein said ionized halogen comprise chlorine.

14. The process of claim 13, wherein said hydrogen halide ions are generated from at least one of HCl, HBr, and HI.

15. A method to enhance etching of submicron features, said method comprising the following steps of:

layering a semiconductor substrate with at least one layer of oxide and at least one layer of nitride;

exposing said layered substrate to a first atmosphere, said first atmosphere comprising halogen ions; and exposing said layered substrate to a second atmosphere, said second atmosphere comprising an ionized hydrogen halide, wherein said first atmosphere and said second atmosphere further comprise fluorine ions, said fluorine ions being generated from NF$_3$.

16. The method according to claim 15, wherein said ions are generated in a reactive ion etcher.

17. The method according to claim 16, wherein said hydrogen halide comprises at least one of HBr, HCl, and HI.

18. The method according to claim 17, wherein an inert gas is added to said first atmosphere, thereby enhancing etch uniformity of said layered substrate.

19. The method according to claim 18, wherein said submicron features have geometries in the approximate range of 1.0 μm or less.

* * * * *